United States Patent
Hoshino et al.

(10) Patent No.: US 7,180,967 B2
(45) Date of Patent: Feb. 20, 2007

(54) CODING APPARATUS AND CODING METHOD

(75) Inventors: Masayuki Hoshino, Yokosuka (JP); Alexander Golitschek Edler von Elbwart, Darmstadt (DE)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/549,615

(22) PCT Filed: Mar. 23, 2004

(86) PCT No.: PCT/JP2004/003907

§ 371 (c)(1),
(2), (4) Date: Sep. 20, 2005

(87) PCT Pub. No.: WO2004/086634

PCT Pub. Date: Oct. 7, 2004

(65) Prior Publication Data

US 2006/0077076 A1     Apr. 13, 2006

(30) Foreign Application Priority Data

Mar. 25, 2003   (JP) .............................. 2003-083500

(51) Int. Cl.
*H03D 1/00*     (2006.01)
(52) U.S. Cl. ....................... 375/340; 375/264; 375/265; 375/267

(58) Field of Classification Search ................ 375/340, 375/341, 335, 265, 207, 267; 370/252, 335, 370/270, 331; 714/702, 755; 341/50
See application file for complete search history.

(56) References Cited

U.S. PATENT DOCUMENTS 5,978,365 A * 11/1999 Yi ............................... 370/331

(Continued)

FOREIGN PATENT DOCUMENTS

EP    1503535    2/2005

(Continued)

OTHER PUBLICATIONS

PCT International Search Report dated Jun. 29, 2004.

(Continued)

*Primary Examiner*—Linh V. Nguyen
(74) *Attorney, Agent, or Firm*—Stevens, Davis, Miller & Mosher, LLP (57) ABSTRACT

A coding apparatus capable of preventing deterioration in demodulation performance without increasing interfering power. In the apparatus, a turbo coding section (100) performs turbo coding on transmission data, and outputs systematic bits and parity bits. A selecting section (200) selects either of two parity bit sequences output from the turbo coding section (100) to output to a mapping section (300-2). Another mapping section (300-1) modulates the systematic bits and performs symbol mapping. The mapping section (300-2) modulates the parity bits and performs symbol mapping. At this time, mapping sections (300-1 and 300-2) perform modulation in modulation schemes instructed from a modulation scheme instructing section (500). The modulation scheme instructed to the mapping section (300-2) is different from the modulation scheme instructed to another mapping section (300-1).

6 Claims, 7 Drawing Sheets

U.S. PATENT DOCUMENTS

| | | | |
|---|---|---|---|
| 6,574,767 B2 * | 6/2003 | Eroz et al. | 714/755 |
| 6,857,098 B2 * | 2/2005 | Eroz et al. | 714/755 |
| 2002/0126763 A1 | 9/2002 | Jeong et al. | |
| 2002/0159423 A1 * | 10/2002 | Yao et al. | 370/342 |
| 2003/0007577 A1 * | 1/2003 | Shiu et al. | 375/341 |
| 2003/0051205 A1 * | 3/2003 | Eroz et al. | 714/792 |
| 2003/0060173 A1 * | 3/2003 | Lee et al. | 455/103 |
| 2004/0161058 A1 * | 8/2004 | Ebiko et al. | 375/340 |
| 2004/0208145 A1 * | 10/2004 | Sim et al. | 370/335 |
| 2005/0193307 A1 * | 9/2005 | Wengerter et al. | 714/749 |
| 2005/0204273 A1 * | 9/2005 | Jeong et al. | 714/801 |

FOREIGN PATENT DOCUMENTS

| | | |
|---|---|---|
| JP | 2000115085 | 4/2000 |
| JP | 200323373 | 1/2003 |
| JP | 200440232 | 2/2004 |
| JP | 2004153640 | 5/2004 |
| WO | 02067491 | 8/2002 |

OTHER PUBLICATIONS

A. Stefanov, et al.; "Turbo-Coded Modulation for Systems with Transmit and Receive Antenna Diversity over Block Fading Channels: System Model, Decoding Approaches, and Practical Consideration," IEEE Journal on selected areas in communications, vol. 19, No. 5, May 2001, pp. 958-968.

H.-J. Su, et al.; "Space-Time Turbo Codes with Full Antenna Diversity," IEEE transactions on communications, vol. 49, No. 1, Jan. 2001, pp. 47-57.

European Search Report dated Apr. 11, 2006.

A. Tonello; "MIMO MAP Equalization and Turbo Decoding in Interleaved Space-Time Coded Systems", Internet Article, XP002374154, http://primo.ismb.it/firb/docs/TCOM2003.pdf, pp. 155-160, Feb. 2003.

J. Kusuma: "A Simple Coded-Modulation Approach to Multi-Antenna Systems", Internet Article, XP002374155, http://www.mit.edu/[kusuma/Papers/ciss2002_codedmodulation.pdf, pp. 1-5, Mar. 1, 2002.

* cited by examiner

CODING APPARATUS AND CODING METHOD

TECHNICAL FIELD

The present invention relates to a coding apparatus and coding method, and more particularly, to a coding apparatus and coding method for performing space-time turbo coding on transmission data.

BACKGROUND ART

In recent years, in error correcting codes in wireless communications, attention has been focused on turbo codes nearing the Shannon limit that is theoretical limit of transmission speed enabling transmission without errors. In turbo coding, generally, a plurality of bit sequences is output such as a sequence of systematic bits that are information bits, a sequence of parity bits that are redundant bits obtained by performing convolutional coding on the systematic bits, and another sequence of parity bits obtained by performing interleaving on the systematic bits and then convolutional coding thereon.

A technique for transmitting thus output plural bit sequences from respective plural transmission antennas is called space-time turbo coding. Space-time turbo coding is one of SDM (Space Division Multiplexing) that spatially multiplexes a plurality of signals on the transmission side.

In space-time turbo coding, a plurality of bit sequences generated by turbo coding is modulated, subjected to symbol mapping, and transmitted from a plurality of transmission antennas assigned to respective bit sequences. For example, see IEEE TRANSACTIONS ON COMMUNICATIONS, VOL. 49, No. 1, JANUARY 2001 "Space-Time Turbo Codes with Full Antenna Diversity", and IEEE JOURNAL ON SELECTED AREAS IN COMMUNICATIONS, VOL. 19, NO. 5, MAY 2001 "Turbo-Coded Modulation for Systems with Transmit and Receive Antenna Diversity over Block Fading Channels: System Model, Decoding Approaches, and Practical Considerations".

By this means, it is possible to achieve both the diversity gain due to transmission using a plurality of transmission antennas and significant coding gain by turbo codes.

However, in performing space-time turbo coding, using M-ary modulation to further improve the transmission efficiency causes such a problem that a large number of overlaps of signal points (hereinafter, referred to as "degeneracy") occur in symbol mapping.

Figure 1A:
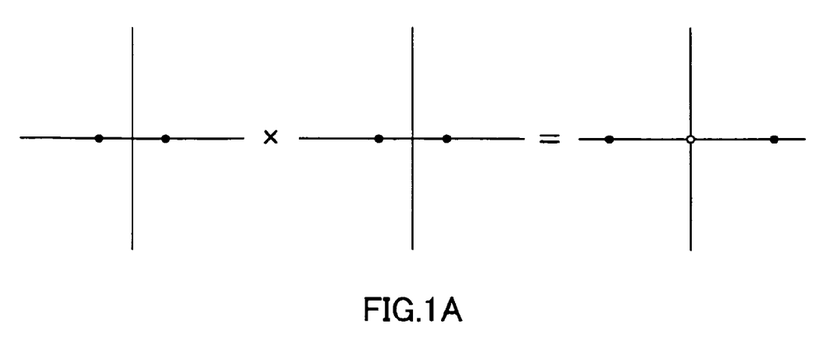
FIG. 1A is a diagram showing an example of signal point constellations in applying BPSK modulation in space-time turbo coding.
Figure 1B:
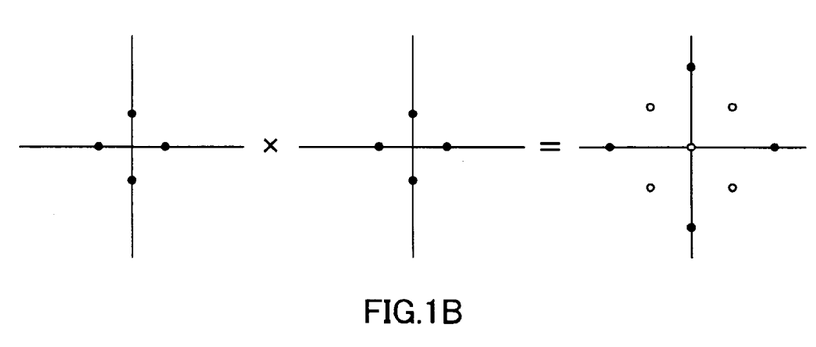
FIG. 1B is a diagram showing an example of signal point constellations in applying QPSK modulation in space-time turbo coding.
Figure 1C:
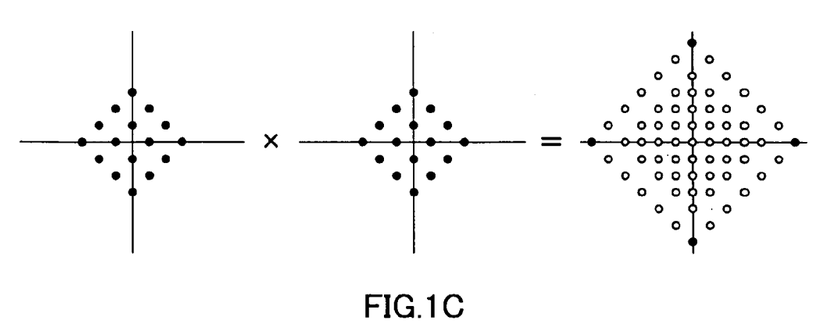
FIG. 1C is a diagram showing an example of signal point constellations in applying 16QAM in space-time turbo coding.

This problem will specifically be described below with reference to FIGS. 1A to 1C. FIGS. 1A to 1C are diagrams showing signal point constellations when a plurality of bit sequences obtained by turbo coding is transmitted from two transmission antennas, as an example of space-time turbo coding.

FIG. 1A is a diagram showing one example of signal point constellations when BPSK (Binary Phase Shift Keying) modulation is performed on each of the bit sequences transmitted from two transmission antennas.

When each of BPSK-modulated bit sequences is subjected to symbol mapping and multiplexed, originally four (=2×2) signal point candidates should exist. However, in the case as shown in FIG. 1A, a white point shown in the figure represents overlapping two points among four points, and degeneracy occurs.

Similarly, FIG. 1B is a diagram showing one example of signal point constellations when QPSK (Quadrature Phase Shift Keying) modulation is performed on each of the bit sequences transmitted from two transmission antennas.

When each of QPSK-modulated bit sequences is subjected to symbol mapping and multiplexed, originally sixteen (=4×4) signal point candidates should exist. However, in the case as shown in FIG. 1B, points except four black points shown in the figure represent overlapping two or four points, and degeneracy occurs. In other words, in the case of QPSK modulation, degeneracy occurs in 75% of entire points, and the probability of occurrence of degeneracy is higher than that in BPSK modulation.

Further, FIG. 1C is a diagram showing one example of signal point constellations when 16QAM (16 Quadrature Amplitude Modulation) is performed on each of the bit sequences transmitted from two transmission antennas.

When each of 16QAM-modulated bit sequences is subjected to symbol mapping and multiplexed, originally 256 (=16×16) signal point candidates should exist. However, in the case as shown in FIG. 1C, points except four black points shown in the figure represent overlapping two or four points, and degeneracy occurs. In other words, in 16QAM, degeneracy occurs in 98% of entire points, and the probability of occurrence of degeneracy is higher than that in QPSK modulation.

Thus, in performing M-ary modulation in space-time turbo coding, since a large amount of degeneracy occurs, demodulation performance deteriorates in a reception apparatus. In order to prevent the demodulation performance from deteriorating, it is necessary to increase transmission power in a transmission apparatus to enhance reception quality in the reception apparatus. As a result, however, increased interfering power is provided to reception apparatuses other than the transmission destination, and adverse effects are exerted on the entire wireless communication system.

DISCLOSURE OF INVENTION

It is an object of the present invention to provide a coding apparatus and coding method capable of preventing deterioration of demodulation performance without increasing interfering power.

A gist of the invention is modulating bit sequences in mutually different modulation schemes in transmitting systematic bits and parity bits obtained by coding from a plurality of transmission antennas.

According to an aspect of the invention, a coding apparatus has a coder which encodes transmission data and outputs systematic bits and parity bits, a modulator that modulates the output systematic bits and parity bits in mutually different modulation schemes, and a transmitter that transmits the modulated systematic bits and parity bits from respective antennas.

According to another aspect of the invention, a coding method has the steps of encoding transmission data to output systematic bits and parity bits, modulating the output systematic bits and parity bits in mutually different modulation schemes, and transmitting the modulated systematic bits and parity bits from respective antennas.

BEST MODE FOR CARRYING OUT THE INVENTION

Embodiments of the present invention will specifically be described below with reference to accompanying drawings.

(Embodiment 1)

Figure 2:
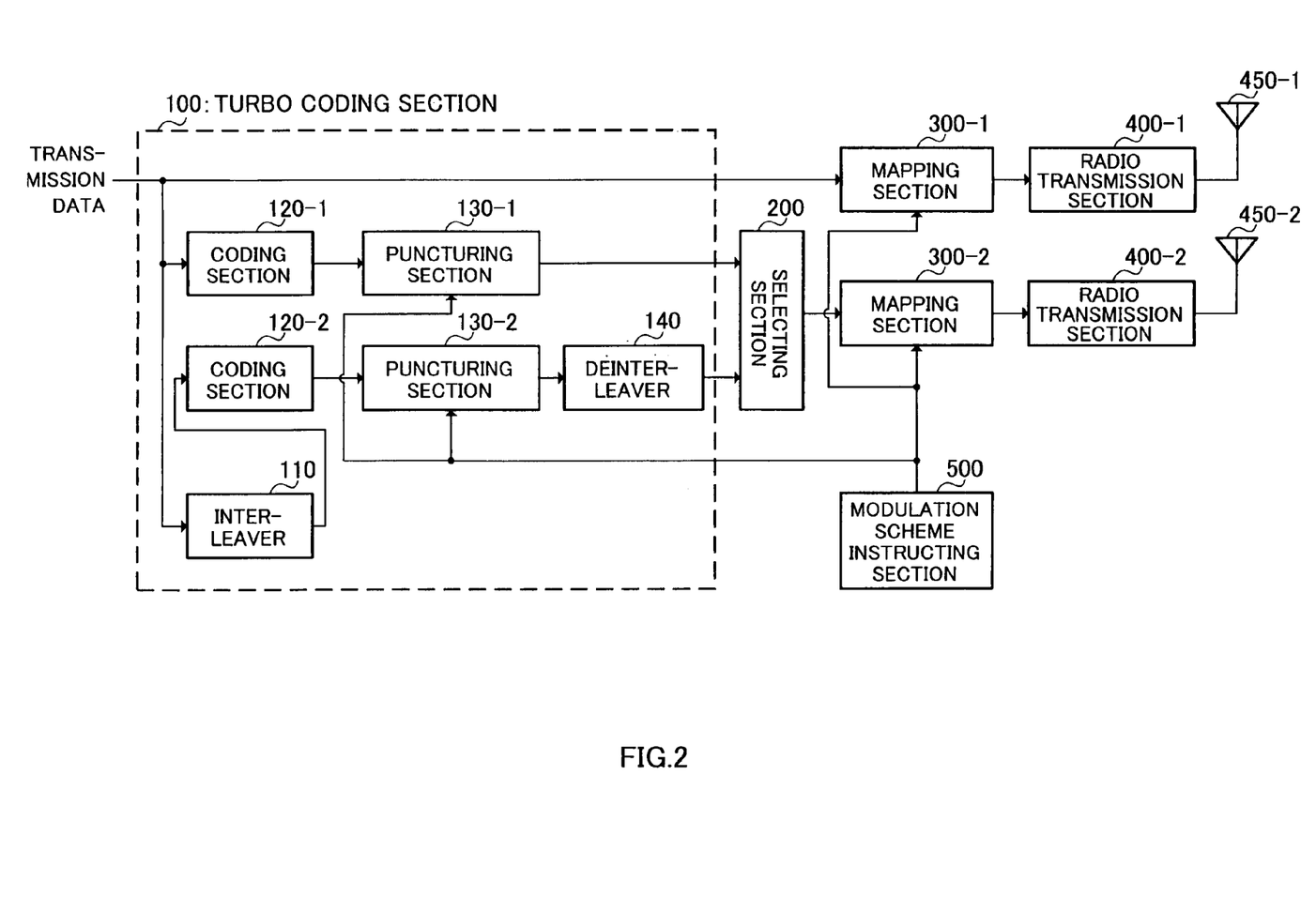
FIG. 2 is a block diagram showing a principal configuration of a space-time turbo coding apparatus according to Embodiment 1 of the invention.

FIG. 2 is a block diagram showing a principal configuration of a space-time turbo coding apparatus according to Embodiment 1 of the invention. The space-time turbo coding apparatus as shown in FIG. 2 is mainly comprised of turbo coding section 100, selecting section 200, mapping sections 300-1 and 300-2, radio transmission sections 400-1 and 400-2, and modulation scheme instructing section 500. Turbo coding section 100 has interleaver 110, coding sections 120-1 and 120-2, puncturing sections 130-1 and 130-2, and deinterleaver 140.

Turbo coding section 100 performs turbo coding on transmission data, and outputs systematic bits that are information bits of the transmission data, and parity bits that are redundant bits obtained by performing convolutional coding on the systematic bits.

More specifically, turbo coding section 100 outputs the transmission data as a sequence of the systematic bits to mapping section 300-1, while further outputting two sequences of parity bits to selecting section 200 as described below.

In other words, coding section 120-1 performs convolutional coding on the transmission data. Puncturing section 130-1 performs puncturing on the coded bit sequence obtained by convolutional coding in coding section 120-1 to thin bits. An output of puncturing section 130-1 is output to selecting section 200 as one parity bit sequence (hereinafter, referred to as "parity bit 1").

Interleaver 110 rearranges (interleaves) the order of the bits of the transmission data. Coding section 120-2 performs convolutional coding on the bit sequence interleaved by interleaver 110. Puncturing section 130-2 performs puncturing on the coded bit sequence obtained by convolutional coding in coding section 120-2 to thin bits. With respect to the bit sequence output from puncturing section 130-2, deinterleaver 140 restores (deinterleaves) the order of bits rearranged by interleaver 110 to the original order. An output of deinterleaver 140 is output to selecting section 200 as another parity bit sequence (hereinafter, referred to as "parity bit 2").

In thinning bits from the coded bit sequence subjected to convolutional coding, each of puncturing sections 130-1 and 130-2 thins bits based on a modulation scheme notified from modulation scheme instructing section 500, which will be described later.

Since deinterleaver 140 restores the order of bits rearranged by interleaver 110, each of two parity bit sequences concurrently output from turbo coding section 100 corresponds to the concurrently output systematic bits.

Selecting section 200 selects either of the two parity bit sequences output from turbo coding section 100 to output to mapping section 300-2.

Mapping section 300-1 modulates the systematic bits output from turbo coding section 100 to perform symbol mapping. At this time, mapping section 300-1 modulates the systematic bits in a modulation scheme instructed from modulation scheme instructing section 500.

Radio transmission section 400-1 performs predetermined radio transmission processing (such as D/A conversion and upconverting) on the systematic bits and transmits a radio signal via antenna 450-1.

Mapping section 300-2 modulates the parity bits output from selecting section 200 to perform symbol mapping. At this time, mapping section 300-2 modulates the parity bits in a modulation scheme instructed from modulation scheme instructing section 500. The modulation scheme instructed to mapping section 300-2 is different from the modulation scheme instructed to mapping section 300-1. In other words, the systematic bits and parity bits are modulated in different modulation schemes.

Radio transmission section 400-2 performs the predetermined radio transmission processing (such as D/A conversion and upconverting) on the parity bits and transmits a radio signal via antenna 450-2.

Modulation scheme instructing section 500 instructs modulation schemes to puncturing sections 130-1 and 130-2 and mapping sections 300-1 and 300-2. At this time, modulation scheme instructing section 500 instructs a modulation scheme to modulate the systematic bits to mapping section 300-1, while instructing another modulation scheme different from such a modulation scheme to mapping section 300-2 as a modulation scheme to modulate the parity bits. Further, modulation scheme instructing section 500 notifies the modulation schemes for systematic bits and parity bits to puncturing sections 130-1 and 130-2, respectively.

The operation of the space-time turbo coding apparatus configured as described above will be described below.

First, turbo coding section 100 performs turbo coding on transmission data. In other words, systematic bits from the transmission data are output to mapping section 300-1. At the same time, the transmission data undergoes convolutional coding in coding section 120-1, and then, puncturing in puncturing section 130-1, and parity bit 1 is output to selecting section 200. Further, the transmission data undergoes interleaving in interleaver 110, convolutional coding in coding section 120-2, puncturing in puncturing section 130-2, and deinterleaving in deinterleaver 140, and parity bit 2 is output to selecting section 200.

Puncturing in puncturing sections 130-1 and 130-2 is performed based on modulation schemes for the systematic bits and parity bits notified from modulation scheme instructing section 500. In other words, since modulation schemes are different between the systematic bits and parity bits, the number of bits to transmit per symbol is different, and therefore, in order not to degrade the correspondence relationship between the systematic bits and parity bits, bits are thinned from the coded bit sequence.

For example, when the systematic bits are modulated in BPSK and the parity bits are modulated in QPSK, one bit is transmitted in one symbol in the systematic bits, while two bits are transmitted in one symbol in the parity bits. Accordingly, the correspondence relationship between the systematic bits and parity bits does not deteriorate, without increasing the number of bits thinned from the coded bit sequence in puncturing sections 130-1 and 130-2.

Meanwhile, when the systematic bits are modulated in QPSK and the parity bits are modulated in BPSK, two bits are transmitted in one symbol in the systematic bits, while one bit is transmitted in one symbol in the parity bits. Accordingly, puncturing sections 130-1 and 130-2 need to thin a larger number of bits than general from the coded bit sequence.

Thus, puncturing is performed to accommodate the difference in modulation scheme between the systematic bits and parity bits, and each of parity bits 1 and 2 is output to selecting section 200.

Then, selecting section 200 selects either parity bit 1 or 2 to output to mapping section 300-2. In selecting parity bits, selecting section 200 may alternately select parity bits 1 and 2, or select according to a predetermined rule. In the case of selecting either parity bit 1 or 2, the section 200 outputs to mapping section 300-2 parity bits corresponding to the systematic bits output to mapping section 300-1.

Then, mapping section 300-1 modulates the systematic bits in the modulation scheme instructed from modulation scheme instructing section 500 to perform symbol mapping. Meanwhile, mapping section 300-2 modulates the parity bits in the modulation scheme instructed from modulation scheme instructing section 500 to perform symbol mapping.

Modulation scheme instructing section 500 instructs different modulation schemes as modulation schemes to apply to the systematic bits and parity bits, and therefore, mapping sections 300-1 and 300-2 perform modulation in different modulation schemes.

For example, modulation scheme instructing section 500 instructs mapping section 300-1 to perform BPSK modulation, while instructing mapping section 300-2 to perform QPSK modulation. In this case, the transmission efficiency is higher in the parity bits than in the systematic bits, thereby increasing the error coding gain due to turbo coding, and the accuracy in demodulated data becomes high in the reception apparatus.

Further, for example, modulation scheme instructing section 500 instructs mapping section 300-1 to perform QPSK modulation, while instructing mapping section 300-2 to perform BPSK modulation. In this case, the transmission efficiency is high in the systematic bits, thereby increasing the transmission rate of information.

Furthermore, in either of above-mentioned cases, as described later, degeneracy is harder to occur in the reception apparatus than in the case of performing QPSK modulation on both the systematic bits and parity bits.

Thus modulated and symbol-mapped systematic bits and parity bits are subjected to the predetermined radio transmission processing (such as D/A conversion and upconverting) in radio transmission sections 400-1 and 400-2, and transmitted from antennas 450-1 and 450-2, respectively. Respective signals transmitted from antennas 450-1 and 450-2 are spatially multiplexed and received in the reception apparatus.

Figure 3A:
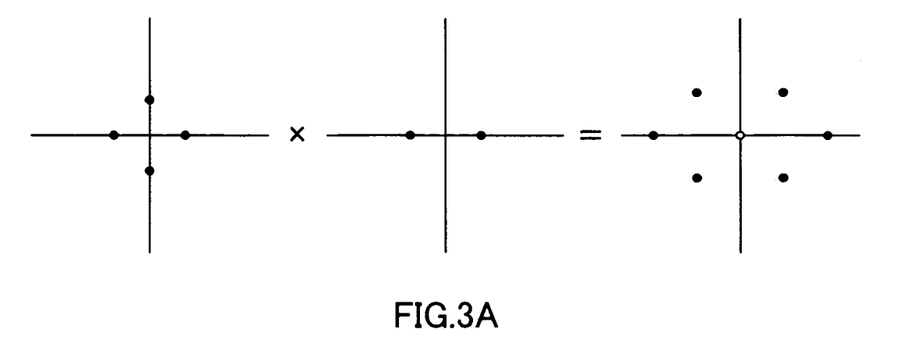
FIG. 3A is a diagram showing an example of signal point constellations according to Embodiment 1.
Figure 3B:
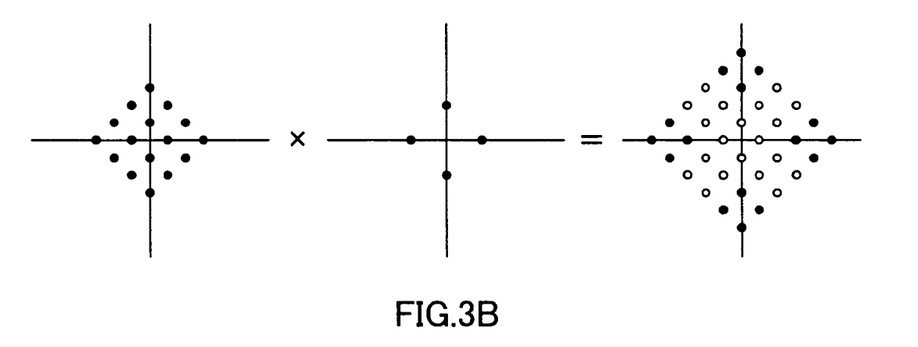
FIG. 3B is a diagram showing another example of signal point constellations according to Embodiment 1.

FIGS. 3A and 3B are diagrams showing examples of systematic bits and parity bits modulated in mutually different modulation schemes being spatially multiplexed. In addition, FIGS. 3A and 3B show the examples such that the largest amount of degeneracy occurs in the reception apparatus.

For example, when either of systematic bits or parity bits are modulated in QPSK and the other bits are modulated in BPSK, eight (=4×2) signal point candidates should exist originally. According to the space-time turbo coding apparatus of this Embodiment, as shown in FIG. 3A, in only a white point in the figure, two points among eight points overlap and degeneracy occurs, and the probability of occurrence of degeneracy is 25%. This probability is much smaller than 75% in the case of performing QPSK modulation on both the systematic bits and parity bits.

Further, for example, when either of systematic bits or parity bits are modulated in 16QAM and the other bits are modulated in QPSK, 64 (=16×4) signal point candidates should exist originally. According to the space-time turbo coding apparatus of this Embodiment, as shown in FIG. 3B, degeneracy occurs in points except sixteen black points in the figure, and the probability of occurrence of degeneracy is 75%. Also in this case, the probability is smaller than 98% in the case of performing 16QAM on both the systematic bits and parity bits.

Thus, according to this Embodiment, puncturing of parity bits is performed to accommodate the difference between mutually different modulation schemes for use in the systematic bits and parity bits, and the systematic bits and parity bits are modulated in mutually different modulation schemes to undergo symbol mapping, and transmitted from respective different antennas. Thus it is possible to achieve both the diversity gain and coding gain due to space-time turbo coding, suppress the probability of occurrence of degeneracy in the reception apparatus, and prevent degradation in demodulation performance without increasing interfering power.

(Embodiment 2)

It is a feature of Embodiment 2 of the invention mapping parity bits 1 and 2 on the in-phase axis and quadrature axis to decrease interference between parity bits.

Figure 4:
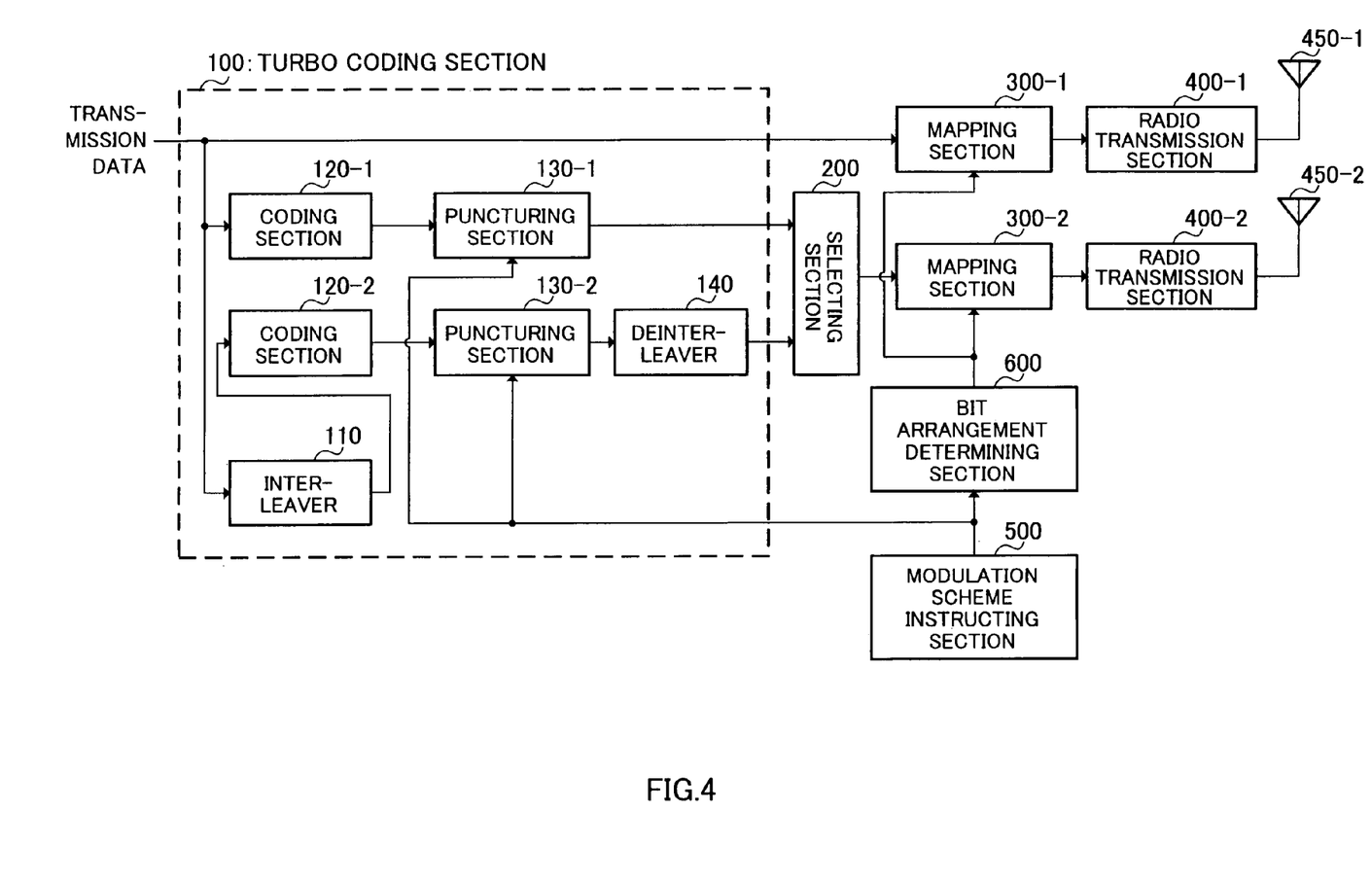
FIG. 4 is a block diagram showing a principal configuration of a space-time turbo coding apparatus according to Embodiment 2 of the invention.

FIG. 4 is a block diagram showing a principal configuration of a space-time turbo coding apparatus according to this Embodiment. In the space-time turbo coding apparatus as shown in the figure, the same sections as in the space-time turbo coding apparatus as shown in FIG. 2 are assigned the same reference numerals to omit descriptions thereof. The space-time turbo coding apparatus as shown in FIG. 4 is mainly comprised of turbo coding section 100, selecting section 200, mapping sections 300-1 and 300-2, radio transmission sections 400-1 and 400-2, modulation scheme instructing section 500 and bit arrangement determining section 600.

Under the modulation scheme of parity bits instructed from modulation scheme instructing section 500, bit arrangement determining section 600 determines a bit arrangement so that two parity bits output from selecting section 200 are mapped on the in-phase axis and quadrature axis, and notifies the determined bit arrangement to mapping section 300-2.

The operation of the space-time turbo coding apparatus configured as described above will be described below.

First, as in Embodiment 1, turbo coding section 100 performs turbo coding on transmission data. As a result of turbo coding, obtained systematic bits are output to mapping section 300-1, while parity bits are output to mapping section 300-2 from selecting section 200.

Mapping section 300-1 modulates the systematic bits in the modulation scheme instructed from modulation scheme instructing section 500, and performs symbol mapping to be in the bit arrangement determined in bit arrangement determining section 600. Meanwhile, mapping section 300-2 modulates the parity bits in the modulation scheme instructed from modulation scheme instructing section 500, and performs symbol mapping to be in the bit arrangement determined in bit arrangement determining section 600.

Also in this Embodiment, modulation scheme instructing section 500 instructs different modulation schemes as modulation schemes to apply to the systematic bits and parity bits, and therefore, mapping sections 300-1 and 300-2 perform modulation in different modulation schemes. In addition, it is assumed in this Embodiment that a modulation scheme providing higher transmission efficiency is applied to the parity bits.

Figure 5A:
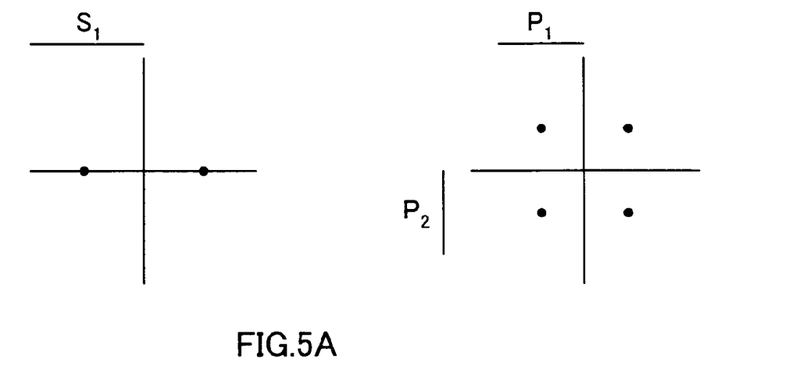
FIG. 5A is a diagram showing an example of bit arrangements according to Embodiment 2.
Figure 5B:
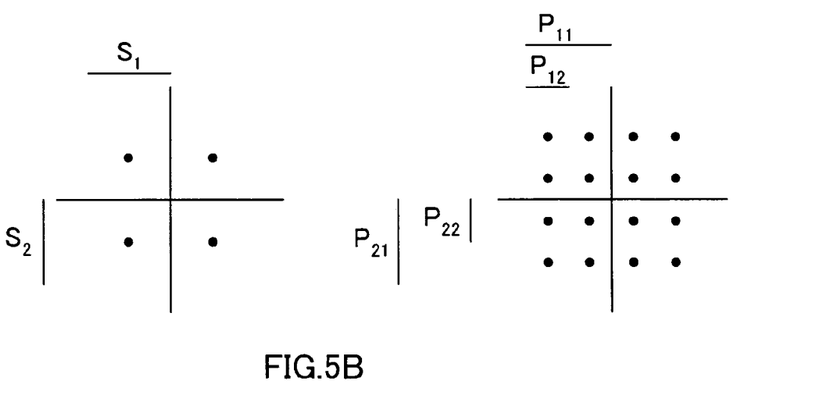
FIG. 5B is a diagram showing another example of bit arrangements according to Embodiment 2.

Bit arrangement determining section 600 determines a bit arrangement such that the parity bits are mapped on the in-phase axis and quadrature axis, as shown in FIGS. 5A and 5B.

In other words, when modulation scheme instructing section 500 instructs bit arrangement determining section 600 to apply BPSK modulation to the systematic bits and QPSK modulation to the parity bits, as shown in FIG. 5A, the section 600 determines a bit arrangement so that a first parity bit (P1) is arranged on the in-phase axis, and that a second parity bit (P2) is arranged on the quadrature axis.

Further, when modulation scheme instructing section 500 instructs bit arrangement determining section 600 to apply QPSK modulation to the systematic bits and 16QAM to the parity bits, as shown in FIG. 5B, the section 600 determines a bit arrangement so that a first parity bit (P11) convolutional coded in coding section 120-1 and a first parity bit (P12) convolutional coded in coding section 120-2 are arranged on the in-phase axis, and that a second parity bit (P21) convolutional coded in coding section 120-1 and a second parity bit (P22) convolutional coded in coding section 120-2 are arranged on the quadrature axis.

By this means, it is possible to reduce interference between parity bits respectively convolutional coded in coding sections 120-1 and 120-2.

When bit arrangements are thus determined, the determined bit arrangements are respectively notified to mapping sections 300-1 and 300-2. Then, mapping section 300-1 modulates the systematic bits and performs symbol mapping. Further, mapping section 300-2 modulates the parity bits and performs symbol mapping.

Thus modulated and symbol-mapped systematic bits and parity bits are subjected to the predetermined radio transmission processing (such as D/A conversion and upconverting) in radio transmission sections 400-1 and 400-2, and transmitted from antennas 450-1 and 450-2, respectively. Respective signals transmitted from antennas 450-1 and 450-2 are spatially multiplexed and received in the reception apparatus.

Even when a phase rotation due to fading or the like is added on the propagation path until the signal is received in the reception apparatus, the cases as shown in FIGS. 3A and 3B are the worst cases where the largest amount of degeneracy occurs. Accordingly, the probability of occurrence of degeneracy is smaller than in the case of applying the same modulation scheme to the systematic bits and parity bits.

Thus, according to this Embodiment, the systematic bits and parity bits are modulated in mutually different modulation schemes, while performing symbol mapping such that the parity bits are arranged on the in-phase axis and the quadrature axis, and transmitted from respective different antennas. Thus it is possible to suppress the probability of occurrence of degeneracy in the reception apparatus, prevent deterioration in demodulation performance without increasing interfering power, and reduce interference between the parity bits.

(Embodiment 3)

It is a feature of Embodiment 3 of the invention performing a bit arrangement so as to uniform reception quality in receiving parity bits 1 and 2 generated by turbo coding.

The principal configuration of the space-time turbo coding apparatus according to this Embodiment is the same as in the space-time turbo coding apparatus (FIG. 4) according to Embodiment 2, and descriptions thereof are omitted. In addition, in this Embodiment, the operation of bit arrangement determining section 600 is different from that in Embodiment 2.

In this Embodiment, under the modulation scheme of parity bits instructed from modulation scheme instructing section 500, bit arrangement determining section 600 determines a bit arrangement so that two parity bits output from selecting section 200 are mapped on the in-phase axis and quadrature axis. Further, bit arrangement determining section 600 determines the bit arrangement so that an arrangement of parity bit 1 convolutional coded in coding section 120-1 is different from that of parity bit 2 convolutional coded in coding section 120-2.

Figure 6:
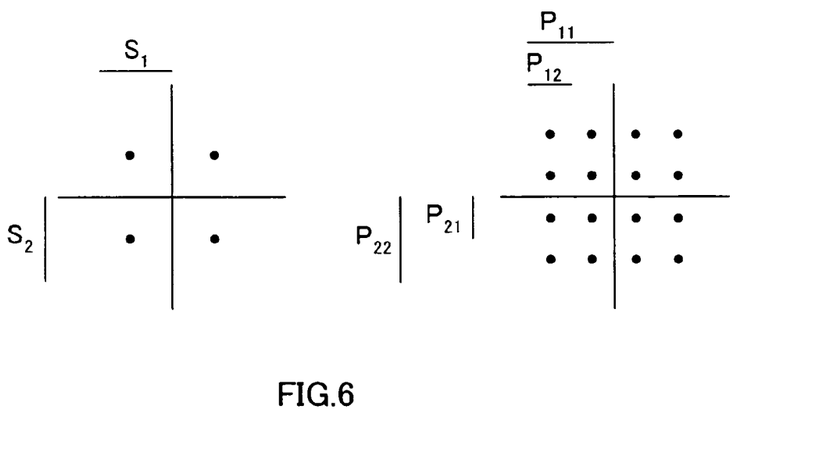
FIG. 6 is a diagram showing an example of bit arrangements according to Embodiment 3 of the invention.

More specifically, when modulation scheme instructing section 500 instructs bit arrangement determining section 600 to apply QPSK modulation to the systematic bits and 16QAM to the parity bits, as shown in FIG. 6, the section 600 arranges parity bits (P11 and P12) convolutional coded in coding section 120-1 on the in-phase axis as in Embodiment 2. Meanwhile, with respect to parity bits (P21 and P22) convolutional coded in coding section 120-2, the section 600 changes the order of bits and arranges the bits on the quadrature axis.

In Embodiment 2 (FIGS. 5A and 5B), with respect to parity bits (P11 and P21) convolutional coded in coding section 120-1, bits taking different values are always arranged on different quadrants on coordinates comprised of arrangement axes. Meanwhile, with respect to parity bits (P12 and P22) convolutional coded in coding section 120-2, bits taking different values are sometimes arranged on the same quadrant on coordinates. Accordingly, reception quality of parity bits P11 and P21 is relatively high in the reception apparatus, while the reception quality of parity bits P12 and P22 are always row in the reception apparatus.

In this Embodiment, since parity bits P21 and P22 re exchanged in the bit arrangement, reception quality f parity bit P22 convolutional coded in coding section 20-2 becomes relatively high, and irrespective of whether bits are convolutional coded in coding section 120-1 or 120-2, the reception quality of parity bits are made uniform.

Thus, according to this Embodiment, the systematic bits and parity bits are modulated in mutually different modulation schemes, while in performing symbol mapping such that the parity bits are arranged on the in-phase axis and the quadrature axis, part of bits are exchanged in the bit arrangement between parity bit 1 and parity bit 2, and the systematic bits and parity bits are transmitted from respective different antennas. Thus it is possible to suppress the probability of occurrence of degeneracy in the reception apparatus, prevent degradation in demodulation performance without increasing interfering power, and reduce interference between the parity bits, while the reception quality is made uniform among a plurality of parity bit sequences.

(Embodiment 4)

It is a feature of Embodiment 4 of the invention changing bit arrangements of the systematic bits and parity bits corresponding to the number of retransmission times.

Figure 7:
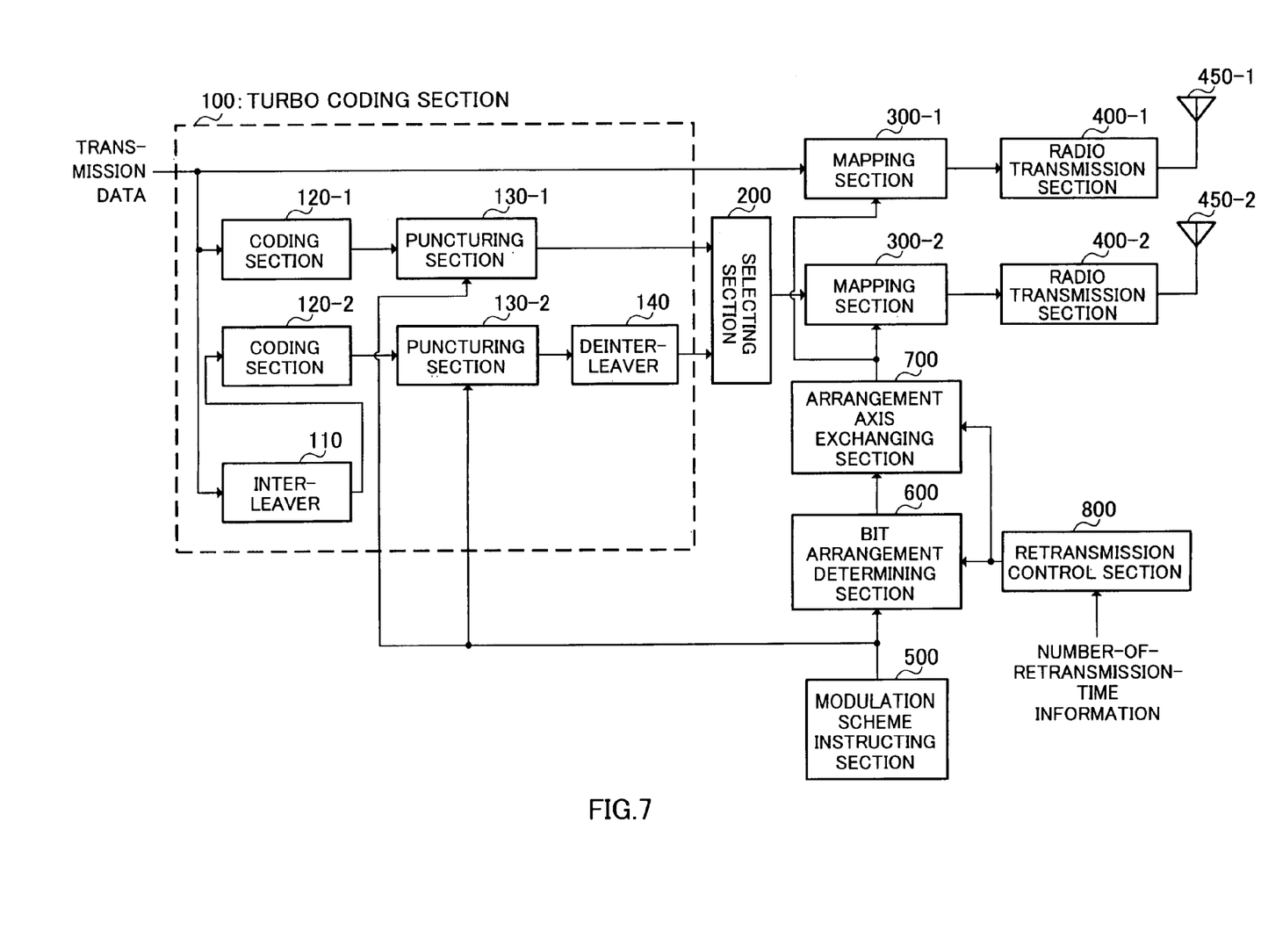
FIG. 7 is a block diagram showing a principal configuration of a space-time turbo coding apparatus according to Embodiment 4 of the invention.

FIG. 7 is a block diagram showing a principal configuration of a space-time turbo coding apparatus according to this Embodiment. In the space-time turbo coding apparatus as shown in the figure, the same sections as in the space-time turbo coding apparatus as shown in FIG. 2 or FIG. 4 are assigned the same reference numerals to omit descriptions thereof. The space-time turbo coding apparatus as shown in FIG. 7 is mainly comprised of turbo coding section 100, selecting section 200, mapping sections 300-1 and 300-2, radio transmission sections 400-1 and 400-2, modulation scheme instructing section 500, bit arrangement determining section 600, arrangement axis exchanging section 700, and retransmission control section 800.

According to control from retransmission control section 800, bit arrangement determining section 600 determines a bit arrangement of parity bits as in Embodiment 2 or 3. In other words, bit arrangement determining section 600 determines a bit arrangement such that the parity bits are mapped on the in-phase axis and quadrature axis, or another bit arrangement such that the parity bits are mapped on the in-phase axis and quadrature axis, while parity bit 1 and parity bit 2 are different in arrangement.

According to control from retransmission control section 800, arrangement axis exchanging section 700 exchanges the arrangement axis in the bit arrangement determined in bit arrangement determining section 600.

Retransmission control section 800 controls bit arrangement determining section 600 and arrangement axis exchanging section 700 corresponding to number-of-retransmission-time information indicative of the number of times the reception apparatus makes a retransmission request for the same data. More specifically, retransmission control section 800 determines whether or not to operate bit arrangement determining section 600 and arrangement axis exchanging section 700 so that bit arrangements of the systematic bits and parity bits are made different every retransmission time.

Generally, when retransmission of the same data is required, the data received in the reception apparatus includes a large amount of errors due to effects of fading and the like on the propagation paths and does not meet the predetermined quality. Accordingly, for example, when the fading variation is slow, if a signal of the same bit arrangement is transmitted at the time of retransmission, the possibility is considered high that the retransmitted data is similarly erroneous.

Then, in this Embodiment, a signal is transmitted using a different bit arrangement every retransmission time.

The operation of the space-time turbo coding apparatus configured as described above will be described below. In addition, it is assumed in following descriptions that modulation scheme instructing section 500 instructs to apply QPSK modulation to the systematic bits and 16QAM to the parity bits.

First, as in Embodiment 1, turbo coding section 100 performs turbo coding on transmission data. As a result of turbo coding, obtained systematic bits are output to mapping section 300-1, and parity bits are output to mapping section 300-2 from selecting section 200.

Meanwhile, when the number-of-retransmission-time information is input to retransmission control section 800, retransmission control section 800 detects the number of retransmission times, and determines whether or not to operate bit arrangement determining section 600 and arrangement axis exchanging section 700.

Herein, it is assumed that retransmission does not occur (the number of retransmission times is zero) for further descriptions.

Figure 8A:
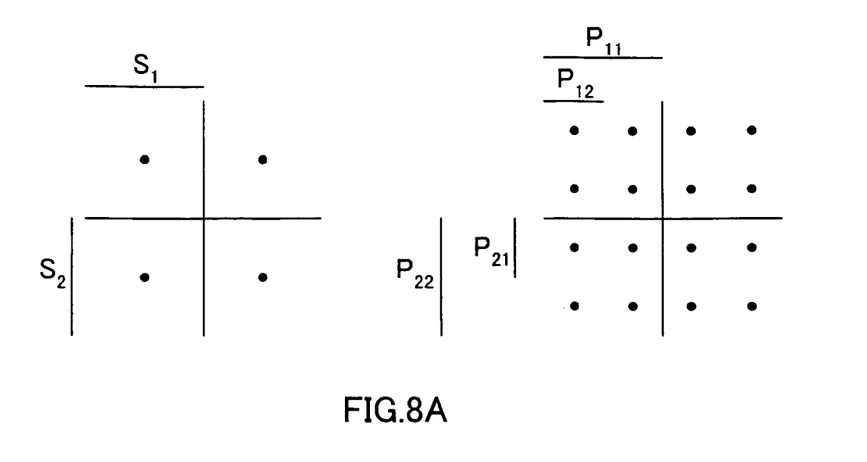
FIG. 8A is a diagram showing an example (first transmitted signal) of bit arrangements according to Embodiment 4.

When the number of retransmission times is zero, by bit arrangement determining section 600 being controlled by retransmission control section 800, the systematic bits and parity bits are both arranged on the in-phase axis and quadrature axis, and second parity bits output from coding sections 120-1 and 120-2 are exchanged in the bit arrangement (see FIG. 8A). Meanwhile, arrangement axis exchanging section 700 does not operate. In other words, when the number of retransmission times is zero, the same bit arrangement as in above-mentioned Embodiment 3 is adopted.

When the bit arrangements are thus determined, the determined bit arrangements are notified to corresponding mapping sections 300-1 and 300-2. Then, mapping section 300-2 modulates the systematic bits to perform symbol mapping. Mapping section 300-2 modulates the parity bits to perform symbol mapping.

Thus modulated and symbol-mapped systematic bits and parity bits are subjected to the predetermined radio transmission processing (such as D/A conversion and upconverting) in radio transmission sections 400-1 and 400-2, and transmitted from antennas 450-1 and 450-2, respectively. Respective signals transmitted from antennas 450-1 and 450-2 are spatially multiplexed and received in the reception apparatus.

At this time, when a signal received in the reception apparatus includes many errors and data of required quality is not obtained, the reception apparatus issues a retransmission request. The retransmission request is received in a receiving section not shown in the figure, and the number of times the retransmission request is received is input to retransmission control section 800 as the number-of-retransmission-time information.

In this way, retransmission control section 800 detects that the number of retransmission times is one.

Further, when the retransmission request is received in the receiving section not shown in the figure, the transmission data required to be retransmitted is turbo coded again in turbo coding section 100. Then, as described above, obtained systematic bits are output to mapping section 300-1, and parity bits are output to mapping section 300-2 from selecting section 200.

Figure 8B:
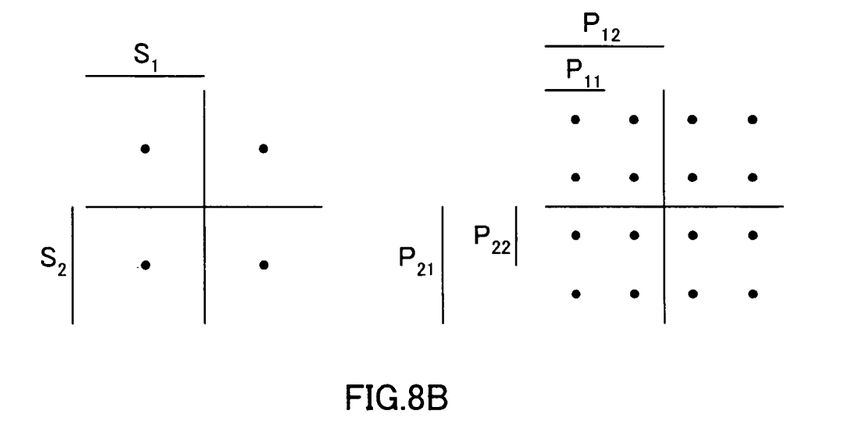
FIG. 8B is a diagram showing another example (retransmitted (second time) signal) of bit arrangements according to Embodiment 4.

When the number of retransmission times is one, by bit arrangement determining section 600 being controlled by retransmission control section 800, the systematic bits and parity bits are both arranged on the in-phase axis and quadrature axis, and first parity bits output from coding sections 120-1 and 120-2 are exchanged in the bit arrangement (see FIG. 8B). Meanwhile, arrangement axis exchanging section 700 does not operate.

Thus, when the number of retransmission times is one, by changing the bit arrangement from the case that the number of retransmission times is zero, the same error is prevented from occurring on the propagation path.

Herein, it is further assumed to continue the explanation that the signal received in the reception apparatus still has many errors and data of required quality is not obtained. In other words, a second retransmission request is issued from the reception apparatus, and the number-of-retransmission-time information is input to retransmission control section 800.

Thus retransmission control section 800 detects that the number of retransmission times is two.

Then, the transmission data required to be retransmitted is turbo coded again in turbo coding section 100. Then, as described above, obtained systematic bits are output to mapping section 300-1, and parity bits are output to mapping section 300-2 from selecting section 200.

When the number of retransmission times is two, by bit arrangement determining section 600 being controlled by retransmission control section 800, the systematic bits and parity bits are both arranged on the in-phase axis and quadrature axis, and second parity bits output from coding sections 120-1 and 120-2 are exchanged in the bit arrangement. Further, arrangement axis exchanging section 700 exchanges the arrangement axes of coordinates to place the systematic bits and parity bits (see FIG. 8C).

Figure 8C:
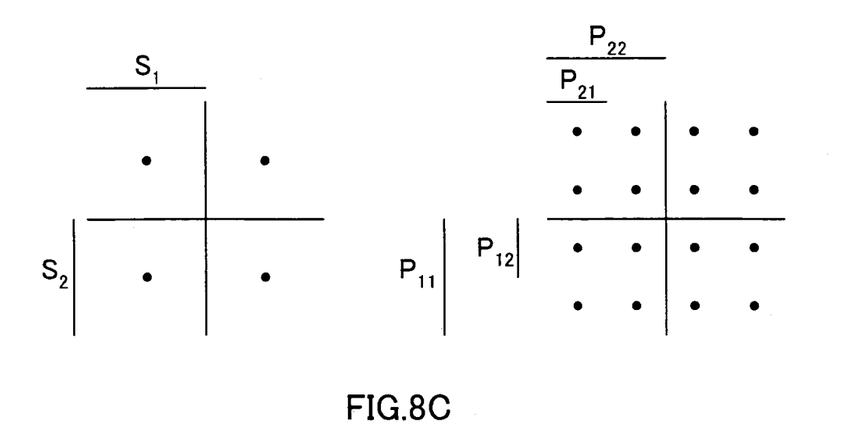
FIG. 8C is a diagram showing still another example (retransmitted (third time) signal) of bit arrangements according to Embodiment 4.

Thus, when the number of retransmission times is two, instead of changing the bit arrangement, the arrangement axes are exchanged on coordinates for bit arrangement to prevent the same error from occurring on the propagation path.

In this way, according to this Embodiment, the systematic bits and parity bits are modulated in mutually different modulation schemes, while changing the bit arrangement whenever retransmission is requested, and the systematic bits and parity bits are transmitted from respective different antennas. Thus it is possible to suppress the probability of occurrence of degeneracy in the reception apparatus, and prevent deterioration in demodulation performance without increasing interfering power. Further, when the fading variation is slow, it is possible to prevent the same error from occurring in retransmission, and improve the throughput of the entire system.

In addition, in this Embodiment, arrangement axes are exchanged when the number of retransmission times is two, but in regard to a combination of a change in bit arrangement and exchange of arrangement axes, the combination is capable of being carried into practice with various modifications thereof.

Further, described in each of the above-mentioned Embodiments are a combination of BPSK modulation and QPSK modulation and another combination of QPSK modulation and 16QAM as examples. However, the invention is not limited to such examples, and applicable to any combinations of modulation schemes that are different from each other, such as a combination of 16QAM and 64QAM and another combination of BPSK modulation and 16QAM.

Furthermore, by way of explanation the number of antennas is two in each of the above-mentioned Embodiments, but the invention is not limited to such a number, and applicable to any number of antennas.

As described above, according to the invention, it is possible to prevent demodulation performance from deteriorating without increasing interfering power.

In other words, a coding apparatus of the invention adopts a constitution having a coder which encodes transmission data and outputs systematic bits and parity bits, a modulator that modulates the output systematic bits and parity bits in mutually different modulation schemes, and a transmitter that transmits the modulated systematic bits and parity bits from respective antennas.

According to this constitution, obtained coded systematic bits and parity bits are modulated in mutually different modulation schemes, and transmitted from corresponding antennas. Therefore, when the transmitted systematic bits and parity bits are multiplexed, the probability of occurrence of degeneracy is low, and it is possible to prevent degradation in demodulation performance without increasing interfering power.

A coding apparatus of the invention adopts a constitution in the above-mentioned constitution where the modulator has a modulation scheme instructor that applies different modulation schemes to the systematic bits and parity bits, a bit arrangement determiner that determines bit arrangements of the systematic bits and parity bits according to the applied modulation schemes, and a mapping section that performs symbol mapping on the systematic bits and parity bits with the determined bit arrangements.

According to this constitution, different modulation schemes are applied to the systematic bits and parity bits, and bit arrangements are determined to perform symbol mapping. Therefore, the demodulation schemes are different between the systematic bits and parity bits, and for example, in applying M-ary modulation in space-time turbo coding, it is possible to decrease the probability of occurrence of degeneracy.

A coding apparatus of the invention adopts a constitution in the above-mentioned constitution where the modulation scheme instructor applies a modulation scheme with a larger modulation M-ary number to the parity bits than in the systematic bits, and the bit arrangement determiner determines a bit arrangement where the parity bits are arranged on the in-phase axis and quadrature axis.

According to this constitution, a modulation scheme with a larger modulation M-ary number is applied to the parity bits than in the systematic bits, the parity bits are arranged on the in-phase axis and quadrature axis, and it is thereby possible to reduce interference between two parity bits occurring in turbo coding, for example.

A coding apparatus of the invention adopts a constitution in the above-mentioned constitution where the coder outputs a plurality of parity bits for one systematic bit, and the bit arrangement determiner determines different bit arrangements for the plurality of parity bits.

According to this constitution, since a plurality of parity bits are output for one systematic bit, and different bit arrangements are determined for the plurality of parity bits, it is possible to prevent reception quality in only one type of parity bits from always deteriorating in the reception apparatus, for example, between two types of parity bits occurring in turbo coding.

A coding apparatus of the invention adopts a constitution in the above-mentioned constitution where the modulator further has an arrangement axis exchanger that exchanges arrangement axes on coordinates to perform bit arrangements determined in the bit arrangement determiner, and the mapping section performs symbol mapping on the systematic bits and parity bits with bit arrangements on the coordinates where the arrangement axes are exchanged.

According to this constitution, since arrangement axes in the bit arrangement are exchanged and then symbol mapping is performed on the systematic bits and parity bits, it is possible to provide the bit arrangement with variations by exchanging the arrangement axes, and prevent the same error from always occurring on the propagation path.

A coding apparatus of the invention adopts a constitution in the above-mentioned constitution further provided with a detector that detects the number of retransmission times of transmission data, and where the bit arrangement determiner changes bit arrangements of the systematic bits and parity bits corresponding to the detected number of retransmission times.

According to this constitution, since bit arrangements of the systematic bits and parity bits are changed corresponding to the number of retransmission times of transmission data, it is possible to prevent the same error from occurring in the retransmitted data, and improve the throughput of the entire system.

This application is based on the Japanese Patent Application No. 2003-083500 filed on Mar. 25, 2003, entire content of which is expressly incorporated by reference herein.

INDUSTRIAL APPLICABILITY

The present invention is applicable to a wireless apparatus mounted on a mobile station apparatus and base station apparatus in a wireless communication system provided with a transmission apparatus and reception apparatus, for example, in a mobile communication system.

FIG. 2 FIG. 4 FIG. 7
100 turbo coding section transmission data
110 interleaver
120-1 120-2 coding section
130-1 130-2 puncturing section
140 deinterleaver
200 selecting section
300-1 300-2 mapping section
400-1 400-2 radio transmission section
500 modulation scheme instructing section FIG. 4 FIG. 7
600 bit arrangement determining section FIG. 7
700 arrangement axis exchanging section
800 retransmission control section number-of-retransmission-time information

The invention claimed is:

1. A coding apparatus comprising:
a coder that encodes transmission data and outputs a plurality of parity bits for one systematic bit;
a modulation scheme instructor that applies a modulation scheme with a larger modulation M-ary number to the parity bits than to the systematic bits;
a bit arrangement determiner that determines bit arrangements of the systematic bits and the parity bits according to the applied modulation scheme;
an arrangement axis exchanger that exchanges part of the bit arrangements so that the determined bit arrangements of the parity bits are different from one another;
a mapping section that performs symbol mapping on the systematic bits in the determined bit arrangements and performs symbol mapping on the parity bits in the exchanged bit arrangements; and
a transmitter that transmits the systematic bits and the parity bits subjected to mapping from a corresponding plurality of antennas.

2. A coding apparatus comprising:
a coder that encodes transmission data and outputs systematic bits and parity bits;
a modulation scheme instructor that applies different modulation schemes to the systematic bits and the parity bits;
a bit arrangement determiner that determines bit arrangements of the systematic bits and the parity bits according to the applied modulation scheme;
an arrangement axis exchanger that exchanges arrangement axes of coordinates to perform the determined bit arrangements;
a mapping section that performs symbol mapping on the systematic bits and the parity bits at the bit arrangements on the coordinates after the arrangement axes are exchanged; and
a transmitter that transmits the systematic bits and the parity bits subjected to mapping from a corresponding plurality of antennas.

3. A coding apparatus comprising:
a coder that encodes transmission data and outputs systematic bits and parity bits;
a detector that detects the number of retransmissions of transmission data;
a modulation scheme instructor that applies different modulation schemes to the systematic bits and the parity bits;
a bit arrangement determiner that determines bit arrangements of the systematic bits and the parity bits according to the applied modulation scheme, and changes the bit arrangements of the systematic bits and the parity bits according to the detected number of retransmissions;
a mapping section that performs symbol mapping on the systematic bits and parity bits in the determined bit arrangements; and
a transmitter that transmits the systematic bits and parity bits subjected to mapping from a corresponding plurality of antennas.

4. A coding method comprising the steps of:
encoding transmission data and outputting a plurality of parity bits for one systematic bit;
applying a modulation scheme with a larger modulation M-ary number to the parity bits than to the systematic bits;
determining bit arrangements of the systematic bits and the parity bits according to the applied modulation scheme;
exchanging part of the bit arrangements so that the determined bit arrangements of the parity bits are different one another;
performing symbol mapping on the systematic bits in the determined bit arrangements and performing symbol mapping on the parity bits in the exchanged bit arrangements; and
transmitting the systematic bits and the parity bits subjected to mapping from a corresponding plurality of antennas.

5. A coding method comprising the steps of:
encoding transmission data and outputting systematic bits and parity bits;
applying different modulation schemes to the systematic bits and the parity bits;
determining bit arrangements of the systematic bits and the parity bits according to the applied modulation scheme;

exchanging arrangement axes of coordinates to perform the determined bit arrangements;

performing symbol mapping on the systematic bits and the parity bits in the bit arrangements on the coordinates after the arrangement axes are exchanged; and transmitting the systematic bits and the parity bits subjected to mapping from a corresponding plurality of antennas.

6. A coding method comprising the steps of:

encoding transmission data and outputting systematic bits and parity bits;

detecting the number of retransmissions of transmission data;

applying different modulation schemes to the systematic bits and the parity bits;

determining bit arrangements of the systematic bits and the parity bits according to the applied modulation scheme, and changing the bit arrangements of the systematic bits and the parity bits according to the detected number of retransmissions;

performing symbol mapping on the systematic bits and parity bits in the determined bit arrangements; and transmitting the systematic bits and parity bits subjected to mapping from a corresponding plurality of antennas.

* * * * *